(12) United States Patent
Baeumer et al.

(10) Patent No.: US 8,373,132 B2
(45) Date of Patent: Feb. 12, 2013

(54) RADIATION DETECTOR WITH A STACK OF SCINTILLATOR ELEMENTS AND PHOTODIODE ARRAYS

(75) Inventors: Christian Baeumer, Dorsten-Rhade (DE); Oliver Muelhens, Aachen (DE); Roger Steadman Booker, Aachen (DE); Christoph Herrmann, Aachen (DE)

(73) Assignee: Koninklijke Philips Electronics N. V., Eindhoven (NL)

( * ) Notice: Subject to any disclaimer, the term of this patent is extended or adjusted under 35 U.S.C. 154(b) by 525 days.

(21) Appl. No.: 12/698,330

(22) Filed: Feb. 2, 2010

(65) Prior Publication Data
US 2010/0200760 A1 Aug. 12, 2010

(30) Foreign Application Priority Data
Feb. 6, 2009 (EP) .................................... 09152283

(51) Int. Cl.
*G01T 1/20* (2006.01)

(52) U.S. Cl. ................... 250/366; 250/367; 250/370.11
(58) Field of Classification Search ............. 250/361 R, 250/366, 368, 370.11, 367
See application file for complete search history.

(56) References Cited

U.S. PATENT DOCUMENTS

| | | | |
|---|---|---|---|
| 4,234,792 A | 11/1980 | DeCou et al. | |
| 4,845,363 A | 7/1989 | Akai | |
| 4,982,095 A | 1/1991 | Takahashi et al. | |
| 7,399,972 B2 | 7/2008 | Yanada et al. | |
| 2002/0153492 A1 | 10/2002 | Sekine et al. | |
| 2008/0253507 A1* | 10/2008 | Levene et al. | 378/19 |

* cited by examiner

*Primary Examiner* — Mark R Gaworecki

(57) ABSTRACT

The invention relates to a radiation detector and a method for producing such a detector, wherein the detector comprises a stack of the scintillator elements and photodiode arrays. The PDAs extend with electrical leads into a rigid body filling a border volume lateral of the scintillator elements, wherein said leads end in a contact surface of the border volume. Moreover, a redistribution layer is disposed on the contact surface, wherein electrical lines of the redistribution layer contact the leads of the PDAs.

18 Claims, 2 Drawing Sheets

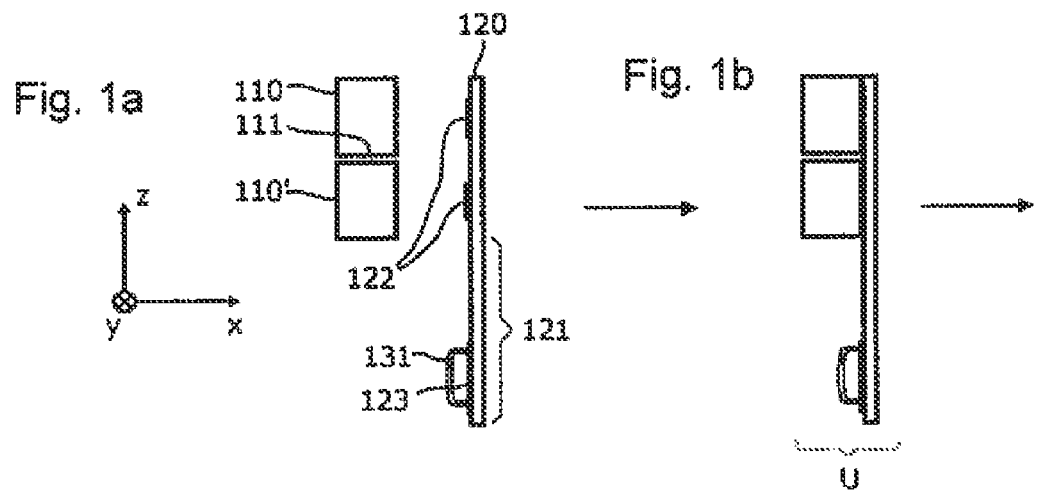
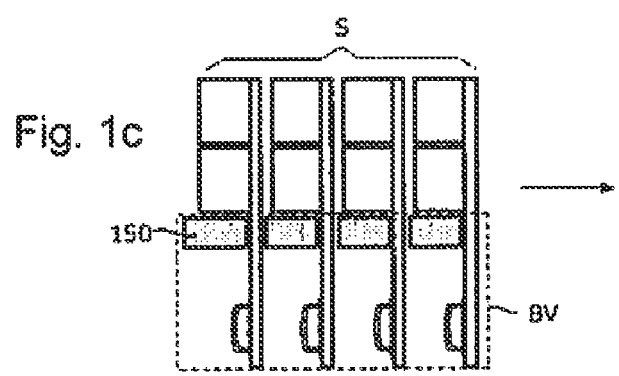
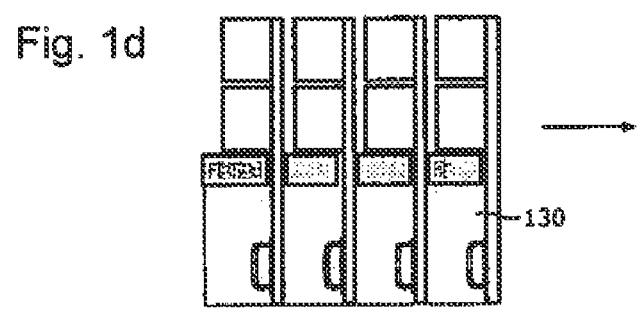

RADIATION DETECTOR WITH A STACK OF SCINTILLATOR ELEMENTS AND PHOTODIODE ARRAYS

CROSS REFERENCE TO RELATED APPLICATIONS

This application claims the benefit of European provisional application serial no. 09152283.9 filed Feb. 6, 2009, which is incorporated herein by reference.

FIELD OF THE INVENTION

The invention relates to a radiation detector comprising a stack of scintillator elements and photodiode arrays (PDAs). Moreover, it relates to a method for producing such a radiation detector and to an imaging device comprising such a radiation detector.

BACKGROUND OF THE INVENTION

The US 20020153492 A1 discloses a radiation detector in which photodiode arrays (PDAs) and scintillator crystals are attached to a planar substrate that extends into a volume lateral of the scintillator crystals. Furthermore, connectors are attached to the substrates in said lateral volume, and a plurality of the resulting components are combined to a stack, wherein the volume lateral of the scintillator crystals is filled with epoxy resin.

SUMMARY OF THE INVENTION

Based on this situation it was an object of the present invention to provide a radiation detector that can readily be manufactured and that has a high sensitivity. It is particularly desirable that said radiation detector is suited for an application in Spectral CT (Computed Tomography) scanners.

This object is achieved by a radiation detector according to claim 1, a method according to claim 2, and an imaging device according to claim 15. Preferred embodiments are disclosed in the dependent claims.

According to its first aspect, the present invention relates to radiation detectors for the detection of electromagnetic radiation, particularly of high-energy radiation like X-ray photons or γ photons. The radiation detector comprises the following components:
a) A stack consisting of scintillator elements and photodiode arrays (or short "PDAs"). Usually, the scintillator elements have a cuboid shape, while the PDAs are substantially flat plates, and the stack typically consists of an alternating sequence of scintillator elements and PDAs with no other intermediate components. Furthermore, the stack is characterized by the following features:
a1) The PDAs extend with electrical leads into a rigid body filling a volume that is lateral of (and usually adjacent to) the scintillator elements and that will be called "border volume" in the following. In this context, the "lateral" direction corresponds to a direction perpendicular to the stacking direction. Moreover, the residual volume of the stack (that part in which also scintillator elements are present) will be called "stack core" in the following to distinguish it from the border volume. Finally, the term "lead" shall denote any electrically conductive component independent of its particular geometric shape.

The scintillator elements will typically be blocks or crystals of a scintillation material that converts incident high energy radiation (e.g. X-rays) into photons of lower energy, particularly photons of the visible spectrum. Said photons can then be detected by photodiodes in the PDAs, i.e. they are converted into electrical signals.
a2) The leads of the PDAs end in a surface of the border volume, wherein this surface will be called "contact surface" in the following because the leads can be contacted in this plane by external circuits. The contact surface is typically perpendicular or slanted with respect to the plane of the PDAs (which plane is perpendicular to the stacking direction).
b) A layer that is disposed on the aforementioned contact surface and that will be called "redistribution layer" in the following, said redistribution layer comprising electrical lines which contact the leads of the PDAs which end in the contact surface. The redistribution layer provides electrical access to the leads of the PDAs, wherein the terminals of the lines on the redistribution layer usually have another geometrical arrangement than the leads on the contact surface.

The invention further relates to a method for providing a radiation detector, particularly a radiation detector with the aforementioned design, said method comprising the following steps:
a) Stacking scintillator elements and PDAs such that the PDAs extend with electrical leads into a border volume lateral of the scintillator elements.
b) At least partially filling the voids between the PDAs in the border volume with a material, for example with epoxy resin, silicone and/or polyimide resin. Optionally also surfaces of the stack can be covered with the same material.
c) Removing a part of the border volume to expose the leads of the PDAs in a contact surface of the border volume, wherein said surface is created by the process of removal (e.g. by etching or cutting). The removal will usually require to wait until initially liquid components of a filling material have solidified.

In an optional further step of the method, a redistribution layer with electrical lines may be disposed on the contact surface after step c) such that said lines contact the leads of the PDAs.

The described radiation detector and the method for producing such a detector provide a design that can readily be manufactured on an industrial scale because first a simple stack of scintillator elements and PDAs can be assembled which can then be fixed in the assumed individual geometry by the material filling the border volume between the PDAs. Due to this design, no additional carrier or substrate (besides the PDAs) has to be provided between the scintillator elements, thus reducing the area that is lost for the detection of radiation to a minimum, i.e. to the thickness of the PDAs. The necessary read-out lines from the detector pixels are provided by the leads on the PDAs, which can readily be contacted by external circuits at the contact surface of the border volume, for example in a flip-chip manner.

In the following, various further developments of the present invention will be described which relate to both the radiation detector as well as to the described method.

As the PDAs can detect high energy radiation directly only with a very low efficiency and another charge yield than the scintillator-PDA-chain, which implies that their direct conversion signal cannot easily be used in conjunction with the scintillator based signal, the area occupied by the PDAs in the plane of radiation incidence is essentially lost for the detection process. To minimize this loss, the PDAs preferably have a thickness (measured perpendicular to the radiation incidence, i.e. usually in stacking direction) of less than 300 μm, preferably less than 150 μm, most preferably less than 100 μm, or even less than 50 μm. As the scintillator elements typically have a thickness of 1000 µm, the lost area can thus be minimized to about 5-30% or less of the whole area.

Basically, the photodiode arrays might comprise just one single photodiode that is adapted to detect secondary (optical) radiation generated in an associated scintillator element. Preferably, at least one PDA comprises however a plurality of photodiodes that can detect secondary photons from different regions of one or more associated scintillator elements. Due to their individual connection to leads extending into the border volume, the signals generated in said photodiodes can separately be read out and attributed to different regions in the associated scintillator elements. Most preferably, at least one PDA comprises a two-dimensional array of photodiodes, which allows to detect high energy radiation with both spatial resolution (i.e. resolved in a direction perpendicular to the radiation incidence) as well as energy resolution (provided by the detection layers in line with the radiation incidence). This makes the radiation detector particularly apt for an application in Spectral CT.

The scintillator elements may be unique blocks with one such block being disposed between two consecutive PDAs. According to a preferred embodiment, there are however at least two scintillator elements that are coupled to the same PDA. These scintillator elements may optionally be separated from each other by reflective layers such that secondary photons generated in one of them are prevented from a transition into a neighboring scintillator element where they would generate undesired cross-talk effects. Furthermore, the separate single scintillator elements are preferably coupled to different photodiodes of the common PDA such that the radiation generated in them can individually be detected. The several scintillator elements may be disposed adjacent to each other in a direction perpendicular to the radiation incidence (thus increasing the spatial resolution) as well as in a direction parallel to the radiation incidence (thus increasing the energy resolution). Particularly in the latter case, the scintillator elements that are disposed one behind the other in radiation direction may consist of materials with different absorption characteristics.

According to another preferred embodiment of the invention, at least one scintillator element is glued to at least one PDA, wherein the term "gluing" shall in a broad sense refer to any process by which the scintillator element and the PDA are materially bonded. By this material bonding, a close connection between the scintillator element and the associated PDA is achieved with a good optical coupling such that almost no secondary photons are lost at the transition from the scintillator element to the PDA. Moreover, a firm mechanical connection between the scintillator elements and the associated PDAs facilitates the stacking process during the manufacture of the radiation detector.

In principle it will suffice that each scintillator element is coupled to a single PDA at one of its sides such that the secondary photons emitted by the scintillator element through this side can be detected. The residual sides of the scintillator element will then typically have a reflective coating to reduce the loss of secondary photons. According to a preferred embodiment of the invention, at least one scintillator element, PDAs are functionally coupled to two, three, or four sides, thus allowing the detection of secondary photons at several sides of this scintillator element. Photodiodes of the several PDAs that are associated to the same pixel may optionally be short-circuited.

The leads of the PDAs have preferably a thickness (measured in stacking direction) of less than 10 µm, most preferably less than 1 µm. Such thin conductive structures can for example be realized by metallization layers on an isolating substrate. To improve their accessibility, the leads of the PDAs are preferably provided with enlargements at the contact surface. This provision with enlargements may be done already during the preparation of the PDAs, i.e. before or immediately after the stacking step a) of the method, or it may be done after the removal in step c).

The enlargements of the leads of the PDAs preferably have an internal diameter in the contact surface of at least 20 µm, most preferably at least 50 µm. In this context, the "internal diameter" of a connected geometrical shape is defined as the diameter of the largest circle that completely fits into this shape. In a rectangle, the internal diameter would for example correspond to the length of the shorter side. The mentioned values for the internal diameter guarantee that sufficient area is provided in the contact surface for a reliable bonding of external contacts.

The enlargements of the leads of the PDAs may be realized in different ways. According to a first option, the enlargements comprise a metallization on the contact surface. Such a metallization can particularly be generated after removing a part of the border volume to expose the electrical leads. It can be produced by standard processes of semiconductor technology, e.g. vapor deposition of a metallic layer and subsequent etching with a suitable mask.

According to another embodiment, the enlargements comprise additional conductor material that is bonded to the leads and cut in the contact surface. In contrast to the aforementioned metallization on the contact surface, the conductor material extends from the contact surface into the depth of the border volume. Particular examples of additional conductor materials are wires bonded at least one position (in the border volume or in the stack core) to the corresponding lead. Another example is a block of a metal or a solder bump attached to the corresponding lead. This option can be combined with the deposition of a metallic layer as described above.

According to another embodiment of the invention, a supporting grid is disposed in the border volume lateral of the stack, with the PDAs extending through apertures of said grid. Such a supporting grid is particularly useful during the manufacturing procedure as it allows a facilitated assemblage of the stack of scintillator elements and associated PDAs before the voids in the border volume are filled. It should be noted that the PDAs are not required to tightly fit to the apertures of the grid because mechanical stability is in the final product provided by the material filling the border volume.

The redistribution layer will usually be connected to electronic components for further processing of the signals provided by the PDAs. In particular, a read-out circuit may be connected to the redistribution layer such that signal processing and read-out takes place in this circuit at close proximity to the origin of signal generation. The read-out circuit may for example be realized by application specific circuits (ASICs).

According to another embodiment, a mechanical carrier may be connected to the redistribution layer and/or to the stack of scintillator elements and PDAs, said carrier allowing the mechanical integration of the radiation detector into a larger system.

The invention further relates to an imaging device comprising a radiation detector of the kind described above. The imaging device may particularly be an X-ray, CT (Computed Tomography), PET (Positron Emission Tomography), SPECT (Single Photon Emission Computed Tomography) or nuclear imaging device.

BRIEF DESCRIPTION OF THE DRAWINGS

These and other aspects of the invention will be apparent from and elucidated with reference to the embodiment(s)

described hereinafter. These embodiments will be described by way of example with the help of the accompanying single drawing in which.

DESCRIPTION OF PREFERRED EMBODIMENTS

Spectral or "color" X-ray imaging is a most promising route for future development of Computed Tomography (CT). While Spectral CT based on counting-mode detectors features good material separation capabilities, implementations realized by multi-layer detectors, multiple X-ray sources with dissimilar kVp (i.e. peak voltage of the source), kVp modulation in time, or combinations of these methods appear to be attractive due to the reduced hardware effort.

Thus a system with a dual-layer current-mode detector and a fast kVp switching X-ray source can be considered as a promising approach in Spectral CT. However, because a dual-layer detector is a rather complex device, its production cannot be carried out according to the standard manufacturing procedures for CT detectors.

A special feature of a dual-layer detector is that the photodiodes are mounted parallel to the beam direction. Because scintillator elements and photodiodes are mounted on a carrier which is oriented perpendicular to the beam direction, electrical leads have to be transferred from vertical planes to a horizontal plane. A manufacturing procedure is therefore required that allows to produce a reliable detection device in large quantities for reasonable costs.

To achieve this object, a back-end process is proposed that facilitates the transfer of electrical signals from the vertical plane of photodiode arrays (PDAs) to the horizontal plane of a substrate (when the direction of radiation incidence is assumed to be the vertical). Thus, it is not necessary to fix photodiodes before mounting the scintillator elements.

Figure 1E:
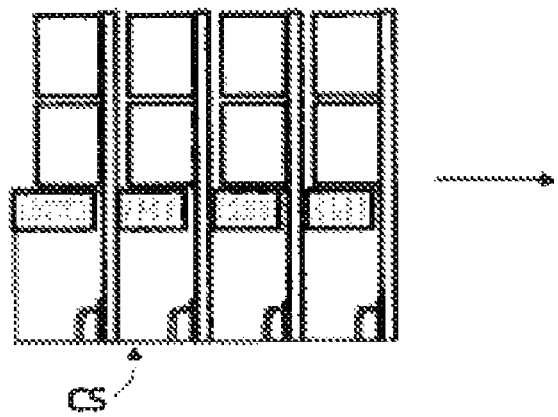
FIG. 1 illustrates several consecutive steps (a)-(g) of the manufacture of a radiation detector according to the present invention.
Figure 1F:
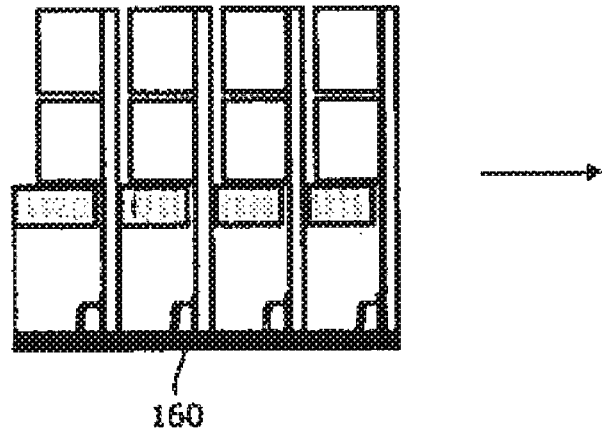
Figure 1G:
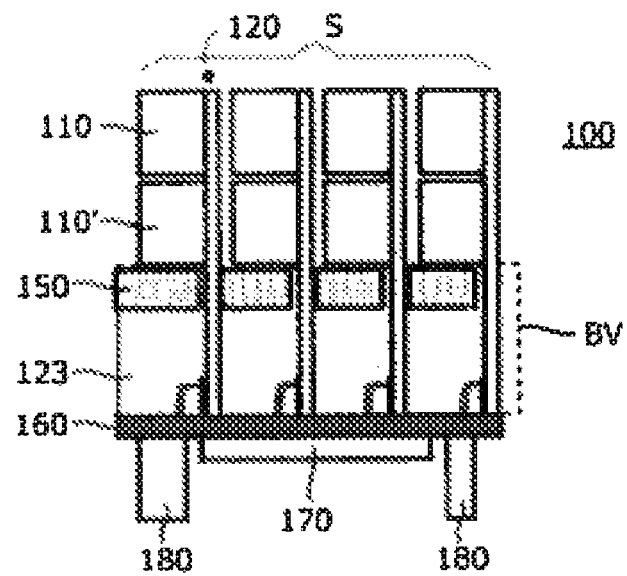

FIG. 1 illustrates consecutive steps of an exemplary manufacturing procedure by which such a radiation detector 100 according to the present invention is produced. It should be noted that the FIGURE depicts only a small part of a complete radiation detector, which typically comprises a much larger number of detector cells.

FIG. 1 a) shows the first step of the procedure, in which two scintillator elements 110, 110' as well as an associated PDA 120 are provided. The two scintillator elements 110, 110' are disposed adjacent to each other lined up in z-direction, which is the direction of radiation incidence during the later operation of the radiation detector. The scintillator elements are typically cuboid blocks of a material like GOS, CsI, ZnSe or CWO that generate secondary photons from incident high energy primary photons. The two scintillator elements are preferably separated from each other by a reflective layer 111 to prevent cross-talk effects.

The PDA 120 typically consists of a plate of a semiconductor material, for example of silicon, with (in this example two) photodiodes 122 formed on its surface by appropriate doping in the regions facing the scintillator elements. Furthermore, electrical leads 123 are provided on said surface of the PDA 120 which are connected to the aforementioned photodiodes 122 and which extend into a lower part 121 of the PDA. Additional wires 131 have been connected to the electrical leads 123 to provide an enlargement of the cross section of the leads.

As an option, the components (e.g. scintillator elements, PDAs, leads etc.) are chosen such that the thermal expansion characteristics are similar, thus reducing the thermo-mechanical stress within the stack during production and operation.

In the next step b) of the manufacturing procedure, the scintillator elements 110, 110' are glued to the photodiodes 122 of the PDA 120. Thus a detector unit U or "slab" results that can be handled as unique, self-carrying structure.

In step c), a plurality of the aforementioned detector units U are mounted one behind the other in the stacking direction (x-direction), yielding a stack S. A supporting grid 150, for example realized by a metal plate with holes for the PDA extensions 121, is used for mechanical support from the bottom side. It is stressed that the supporting grid 150 and the PDA extensions 121 do not have to connect mechanically or electrically, thus relaxing constraints on the production process.

The next production step d) comprises molding in order to fill the voids in the "border volume" BV lateral of the scintillator elements 110, 110' with a filling material 130. This filling material 130 can for example comprise epoxy and/or silicone. Optionally also the surface of one, two, three, four or five of the remaining sides of the stack S can be covered with the same material.

In step e), a part of the bottom volume is removed to access the leads 123 of the PDAs 120 in a contact surface CS. This removal can for example be done by etching or by dicing and polishing.

In step f), a redistribution layer 160 is applied in a metallization process. Now the detector module can be flip-chip bonded to a carrier (as in current CT scanners), or a readout ASIC 170 and other electronics components can directly be mounted on the redistribution layer 160. Another part of the bottom side of the module can be used to attach the module to a mechanical support structure 180.

The described technology allows for the following novel features:

Light detection from two, three, or four sides of the scintillator element(s). The leads of all photodiodes of one scintillator can be short-circuited in this embodiment and connected to the readout chip. Such a light detection from more than one side can increase the efficiency compared to a design with reflective coatings on said side(s) (because reflection is never ideal and photons are lost).

The module can be built without an expensive ceramics carrier.

Three or more scintillator layers can be realized easily.

PDAs can be thinned, particularly to a thickness of less than about 0.2 mm. As the PDAs can be glued to scintillator elements before assembling the detector matrix, they need not be self-supporting.

An important application of the invention is Computed Tomography with energy resolution, or projection imaging with energy resolution. Moreover, the invention may be used in any other application that may benefit from energy-resolving X-ray photon detection.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. A radiation detector, comprising:
   a) a stack of scintillator elements and photodiode arrays, wherein at least one of the scintillator elements is functionally coupled to the photodiode arrays on two, three, or four sides, wherein
   the photodiode arrays extend with electrical leads into a rigid body filling a border volume lateral of the scintillator elements, and
   said leads end in a contact surface of the border volume;
   b) a redistribution layer that is disposed on the contact surface and that comprises electrical lines which contact the leads of the photodiode arrays.

2. The radiation detector according to claim 1 wherein the contact surface is substantially perpendicular to the photodiode arrays.

3. The radiation detector according to claim 1 wherein the photodiode arrays have a thickness of less than 100 μm.

4. The radiation detector according to claim 1 wherein at least one photodiode array comprises a plurality of photodiodes that are individually connected to the leads extending into the border volume.

5. The radiation detector according to claim 1 wherein at least one photodiode array comprises a two-dimensional array of photodiodes.

6. The radiation detector according to claim 1 wherein at least two scintillator elements are coupled to the same photodiode array.

7. The radiation detector according to claim 1 wherein at least one scintillator element is glued to a photodiode array.

8. The radiation detector according to claim 1 wherein the leads of the photodiode arrays are provided with enlargements in the contact surface.

9. The radiation detector according to claim 1 wherein a supporting grid is disposed in the border volume with the photodiode arrays extending through the apertures of the grid.

10. The radiation detector according to claim 1 wherein a readout circuit is connected to the redistribution layer.

11. The radiation detector according to claim 1 wherein a mechanical carrier is connected to the redistribution layer and/or the stack of scintillator elements and photodiode arrays.

12. An imaging device comprising a radiation detector according to claim 1.

13. A method for producing a radiation detector, comprising the following steps:
    a) stacking scintillator elements and photodiode arrays such that the photodiode arrays extend with electrical leads into a border volume lateral of the scintillator elements;
    b) at least partially filling voids between the photodiode arrays in the border volume with a material;
    c) removing a part of the border volume to expose the leads of the photodiode arrays in a contact surface.

14. The method according to claim 13, wherein after step c) a redistribution layer with electrical lines is disposed on the contact surface such that said lines contact the leads of the photodiode arrays.

15. The method according to claim 13, wherein the contact surface is substantially perpendicular to the photodiode arrays.

16. The method according to claim 13, wherein at least one photodiode array comprises a plurality of photodiodes that are individually connected to the leads extending into the border volume.

17. The method according to claim 13, wherein at least one scintillator element is functionally coupled to photodiode arrays on two, three, or four sides.

18. The method according to claim 13, wherein a mechanical carrier is connected to the redistribution layer and/or the stack of scintillator elements and photodiode arrays.

* * * * *